(12) United States Patent
Dong et al.

(10) Patent No.: US 9,766,500 B2
(45) Date of Patent: Sep. 19, 2017

(54) ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tingze Dong, Beijing (CN); Dongsheng Huang, Beijing (CN); Dawei Zhang, Beijing (CN); Qian Zhang, Beijing (CN); Zhao Chen, Beijing (CN); Jun Mo, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/906,479

(22) PCT Filed: May 18, 2015

(86) PCT No.: PCT/CN2015/079163
§ 371 (c)(1),
(2) Date: Jan. 20, 2016

(87) PCT Pub. No.: WO2016/119338
PCT Pub. Date: Aug. 4, 2016

(65) Prior Publication Data
US 2016/0370659 A1    Dec. 22, 2016

(30) Foreign Application Priority Data
Jan. 27, 2015    (CN) .......................... 2015 1 0041303

(51) Int. Cl.
*G02F 1/1337* (2006.01)
*G02F 1/1362* (2006.01)
(Continued)

(52) U.S. Cl.
CPC .......... *G02F 1/133784* (2013.01); *G02F 1/13* (2013.01); *G02F 1/1337* (2013.01);
(Continued)

(58) Field of Classification Search
CPC ........ G02F 1/1337; G02F 1/13; G02F 1/1345; G02F 1/1339; H01L 2924/0002; H01L 22/32; H01L 27/124
(Continued)

(56) References Cited

U.S. PATENT DOCUMENTS

2009/0059149 A1    3/2009  Maeda et al.
2010/0002180 A1*   1/2010  Kim .................... G02F 1/13452
                                                            349/143
(Continued)

FOREIGN PATENT DOCUMENTS

CN    101963714 A    2/2011
CN    103033991 A    4/2013
(Continued)

OTHER PUBLICATIONS

Written Opinion of the International Searching Authority, Oct. 8, 2015 (5 pages).
(Continued)

*Primary Examiner* — Evan Pert
*Assistant Examiner* — Changhyun Yi
(74) *Attorney, Agent, or Firm* — Harness, Dickey & Pierce, P.L.C.

(57) ABSTRACT

Embodiments of the present invention provide an array substrate and a display device. The array substrate comprises a display area and a non-display area located in the periphery
(Continued)

of the display area. A signal unit for transmitting external control signal and a gap region in which the signal unit is not disposed are provided in the non-display area. An auxiliary unit is disposed in the gap region, and the auxiliary unit and the signal unit have the same height and are electrically isolated from each other. A surface pattern of the signal unit is the same as that of the auxiliary unit in any corresponding part. In the array substrate, the segment difference in the non-display area due to the wiring are eliminated, and Rubbing Mura due to uneven rubbing strength of the rubbing roller on the periphery is reduced or eliminated, thereby achieving consistent rubbing effects.

17 Claims, 1 Drawing Sheet

(51) Int. Cl.
H01L 21/66 (2006.01)
H01L 27/12 (2006.01)
G02F 1/1343 (2006.01)
G02F 1/1368 (2006.01)
G02F 1/13 (2006.01)
G02F 1/1345 (2006.01)
G02F 1/1333 (2006.01)

(52) U.S. Cl.
CPC ........ *G02F 1/1368* (2013.01); *G02F 1/13458* (2013.01); *G02F 1/134336* (2013.01); *G02F 1/136286* (2013.01); *H01L 22/32* (2013.01); *H01L 27/124* (2013.01); *G02F 2001/133388* (2013.01); *G02F 2201/123* (2013.01)

(58) Field of Classification Search
USPC ............ 257/48, E21.522; 349/143, 153, 190
See application file for complete search history.

(56) References Cited

U.S. PATENT DOCUMENTS

2011/0234963 A1*  9/2011  Chien ................. G02F 1/13454
                                                          349/149
2014/0211120 A1   7/2014  Yang et al.
2014/0232954 A1*  8/2014  Suzuki ................ G02F 1/13306
                                                          349/12

FOREIGN PATENT DOCUMENTS

| CN | 103869546 A | 6/2014 |
| CN | 104280939 | 1/2015 |
| CN | 204101854 | 1/2015 |
| CN | 104536174 | 4/2015 |
| KR | 10-2014-0097774 | 8/2014 |

OTHER PUBLICATIONS

Office Action from corresponding Chinese Application No. 201510041303.2, Nov. 22, 2016 (7 pages).

* cited by examiner

ARRAY SUBSTRATE AND DISPLAY DEVICE

TECHNICAL FIELD

Embodiments of the present invention relates to the field of display technology, and in particular, to array substrate and display device.

BACKGROUND

Liquid Crystal Display (LCD) is the most widely used one among various types of flat-panel display devices at present. The main component part of a LCD is a liquid crystal panel which mainly comprises a color film substrate, an array substrate and liquid crystal provided therebetween. Thin Film Transistors (TFTs) are disposed in the array substrate. Electric fields are generated by pixel electrodes connected with the TFTs, so as to control the driving of the liquid crystal and realize image display.

In a liquid crystal panel, in order to obtain uniform arrangement and initial directions of liquid crystal molecules, it is required to align the liquid crystal. In prior arts, the initial directions of liquid crystal molecules are generally controlled by means of an alignment film. The alignment film is disposed at one side of each of the color film substrate and the array substrate facing the liquid crystal layer, and is endowed with an alignment capability by a rubbing process. In the rubbing process, a rubbing roller whose outer surface is coated with rubbing cloth is generally used to roll on the alignment film in a set direction. By means of the rubbing force applied to the alignment film by the cloth, alignment grooves with consistent directions are formed on the surface of the alignment film, such that the liquid crystal molecules are arranged along the alignment grooves in a certain direction to realize the alignment of the liquid crystal.

In the rubbing process, the rubbing roller also applies a pressure in the vertical direction to the alignment film. As a consequence, the flatness degree of the rubbed side of the alignment film has a great influence on the depth of the alignment groove. If there exists a height difference somewhere on the rubbed side, the fibers of the rubbing cloth will create uneven deformations such that alignment grooves with uneven depths are formed on the rubbed side. However, for a liquid crystal panel, a display area for image display and a non-display area surrounding the periphery of the display area generally have different flatness degrees. In general case, in each of the color film substrate and the array substrate, the region corresponding to the display area is relatively flat. However, in the non-display area shown in FIG. 1, especially in the region 4 of the array substrate corresponding to the non-display area, because there exists, in the signal unit 1 on the array substrate, wiring 11 and 13 between the TFTs and the driver chip, segment differences due to fabrication process which have a plurality of different heights are formed between the signal unit 1 and the gap region 2 in the non-display area. Meanwhile, in order to ensure the product yield, as shown in FIG. 1, a test pad 31 is generally further disposed in the non-display area, and the structure of the test pad 31 is only partially the same as that of the TFT. Meanwhile, a corresponding test via-hole 32 may be further disposed in the test pad 31 as required. A drive signal is loaded through the test via-hole 32 and transmitted via wiring 33 so as to test the TFT array after some key process. In the case where the test via-hole 32 is disposed in the test pad 31, a big segment difference is formed between the test via-hole 32 and respective functional layers in the array substrate.

When rubbing alignment is performed on the array substrate by using the rubbing process, the rubbing cloth will create different deformations due to the influence from the big segment difference on the substrate surface. Because the deformations of the cloth fibers have a certain cumulative property (or memory property), if the fiber deformations due to the segment difference are not relieved in time, then on one hand, the utilization rate and service life of the cloth will be decreased dramatically, causing the degree of badness of the rubbed side to increase gradually, and on the other hand, such deformations will lead to uneven rubbing strength of the cloth on the substrate, thereby causing uneven depths of the alignment grooves formed in the alignment film. The uneven depths of the alignment grooves tend to cause the badness such as Rubbing Mura to occur along the rubbing direction, thereby decreasing the product yield.

The Rubbing Mura is a serious quality problem in the rubbing process. It not only seriously influences the image quality of a product, but also has a low ET detection rate, which leads to a serious waste of resource and material at the back end as well as quality problem. Meanwhile, as to what kind of wiring structure can be used in the color film substrate and the array substrate (especially the array substrate) to reduce the Rubbing Mura, it is a difficult problem in the rubbing process all the time.

SUMMARY

With respect to the above defects in the prior art, there are provided an array substrate as well as a display device which eliminate the segment difference due to the wiring in the non-display area, and reduce or eliminate Rubbing Mura due to uneven rubbing strength, thereby achieving consistent rubbing effects.

An embodiment of the present invention provides an array substrate comprising a display area and a non-display area located in the periphery of the display area. A signal unit for transmitting external control signal and a gap region in which the signal unit is not disposed are provided in the non-display area. An auxiliary unit is disposed in the gap region, and the auxiliary unit and the signal unit have the same height and are electrically isolated from each other. A surface pattern of the signal unit is the same as that of the auxiliary unit in any corresponding part.

The signal unit may be disposed at an edge in the non-display area away from the display area, and a plurality of parallel-arranged strip-shaped connection terminals may be disposed in the signal unit. The gap region may be disposed at an edge in the non-display area corresponding to the signal unit, and the auxiliary unit may include a plurality of parallel-arranged strip-shaped structures. The arranging direction of the plurality of strip-shaped structures is the same as that of the plurality of strip-shaped connection terminals in the signal unit, and the interval between the plurality of strip-shaped structures is the same as that between the plurality of strip-shaped connection terminals.

The length and width of each strip-shaped structure may be respectively the same as those of the strip-shaped connection terminal.

A control element may be disposed in the display area. The signal unit is connected to the control element and an external control signal supplying unit. The auxiliary unit may have the same layered structure as the signal unit and the control element.

The control element may be a thin film transistor array. The thin film transistor includes a gate, a gate insulator layer, an active layer, a source and a drain disposed in a same layer, a passivation layer and a pixel electrode layer. The gates of the thin film transistors arranged in a same row/column are connected with a same gate line. The auxiliary unit may include an auxiliary gate layer, an auxiliary gate insulator layer, an auxiliary active layer, an auxiliary source/drain layer, an auxiliary passivation layer and an auxiliary pixel electrode layer disposed above the auxiliary passivation layer, which correspond to respective layers of the thin film transistor. The thicknesses of respective layers in the auxiliary unit are respectively the same as those of the respective corresponding layers of the thin film transistor.

The respective layers in the auxiliary unit and the respective corresponding layers of the thin film transistor may be formed by using the same material in the same patterning process.

Connection via-holes may be provided in the strip-shaped connection terminals. Auxiliary via-holes may be provided in the strip-shaped structures at positions corresponding to the connection via-holes in the strip-shaped connection terminals. The auxiliary via-holes and the connection via-holes have the same size and depth.

The auxiliary via-holes may include auxiliary gate insulator layer via-holes provided in the auxiliary gate insulator layer, and/or auxiliary passivation layer via-holes provided in the auxiliary passivation layer.

A test unit may be further disposed at a position in the non-display area close to the display area. The test unit is correspondingly disposed in a distribution region corresponding to the strip-shaped structures in the auxiliary unit. The test unit may include a plurality of separately disposed test pads for connecting with the thin film transistors. Test via-holes are provided in the test pads.

Another embodiment of the present invention provides a display device comprising the array substrate described above.

In the array substrate according to the embodiment of the present invention, on the basis of reserving the original functions, the segment difference in the non-display area due to the wiring is eliminated, and Rubbing Mura due to uneven rubbing strength is reduced or eliminated, thereby achieving consistent rubbing effects.

Correspondingly, the display device using the array substrate has a good display effect.

DETAILED DESCRIPTION

For enabling those skilled in the art to better understand the technical solution of the present invention, the array substrate as well as the display device according to embodiments of the present invention will be further described hereinafter in detail in conjunction with the drawings and embodiments.

After research, the inventors found that Rubbing Mura has a low tendency to appear in a low-end display device product with a low resolution. In this case, the influence from the uneven rubbing caused due to the wiring difference of the test pad located in the periphery of the array substrate is not apparent, and thus it is not an important factor causing Rubbing Mura. However, in a high-end display device product with a high resolution, because the resolution is high, the segment difference due to the wiring in the array substrate becomes the main cause for Rubbing Mura. On the basis of this research, the root cause for Rubbing Mura does not lie in the rubbing process. Rather, the segment difference caused due to the difference between the wiring designs for the thin film transistor array in the display area and the peripheral circuit in the non-display area, as well as the uneven rubbing caused due to the via-hole of the test pad, become the important causes for Rubbing Mura.

Figure 1:
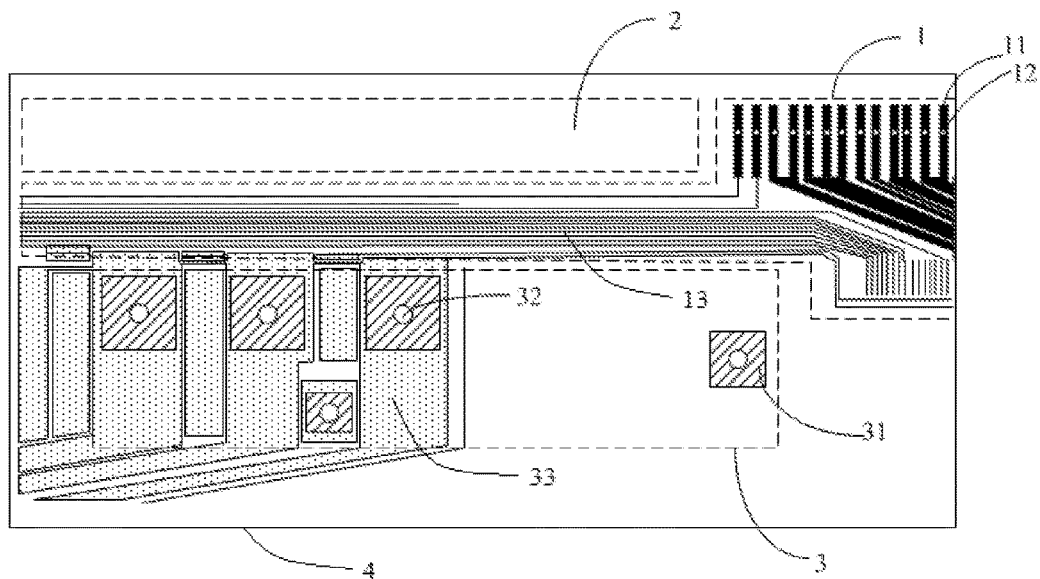
FIG. 1 is a structural schematic diagram of a non-display area of the array substrate in the prior art.
Figure 2:
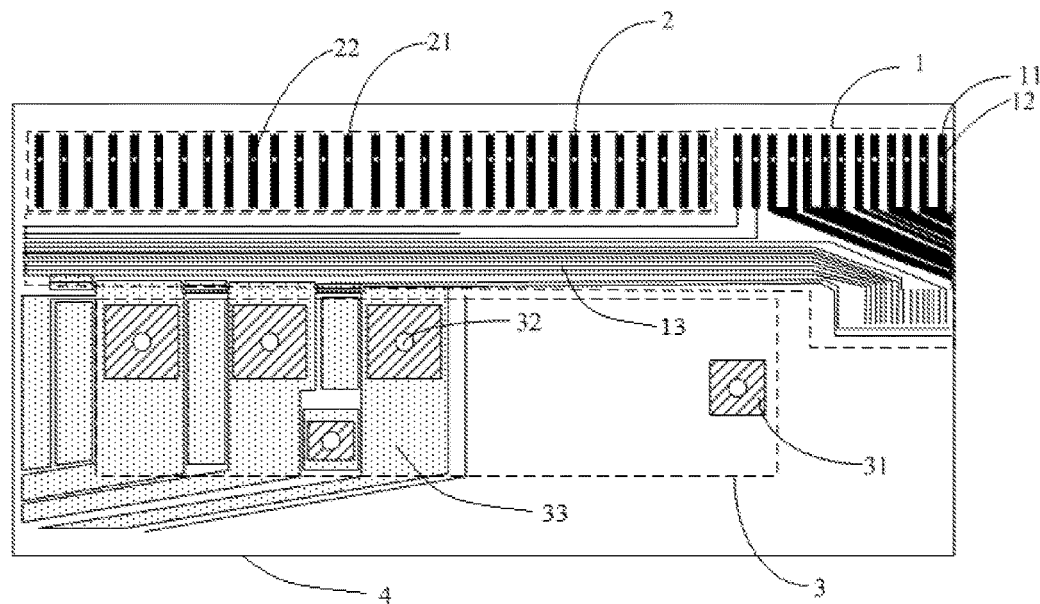
FIG. 2 is a structural schematic diagram of a non-display area of the array substrate according to an embodiment of the present invention.

An embodiment of the present invention provides an array substrate comprising a display area and a non-display area surrounding the periphery of the display area. By reference to FIG. 2, the non-display area is provided with a signal unit 1 for connecting external control signal and a gap region 2 in which the signal unit is not disposed. The signal unit 1 is provided with a plurality of parallel-arranged strip-shaped connection terminals 11, and the gap region 2 is provided with an auxiliary unit. The auxiliary unit and the signal unit have the same height and are electrically isolated from each other. A surface pattern of the signal unit 1 is the same as that of the auxiliary unit in any corresponding part. As an exemplary example, as shown in FIG. 2, the auxiliary unit in the gap region 2 has a transverse length greater than that of the signal unit 1, and the surface pattern of the signal unit 1 can be mapped to a same surface pattern at any position in the transverse direction of the auxiliary unit. By arranging the height of the auxiliary unit and the height of the signal unit to be the same as each other, the auxiliary unit plays a function of flattening, such that the gap region and the signal unit region in the non-display area have consistent flatness and uniform patterns at any corresponding positions, so as to effectively ensure the state of the rubbing cloth of the rubbing roller to be uniform.

Specifically, as shown in FIG. 2, the signal unit 1 is disposed at an edge in the non-display area away from the display area, and the signal unit 1 is provided with a plurality of parallel-arranged strip-shaped connection terminals 11. The gap region 2 is correspondingly disposed at an edge in the non-display area corresponding to the signal unit 1, and the gap region 2 is provided with an auxiliary unit. The auxiliary unit includes a plurality of parallel-arranged strip-shaped structures 21. The arranging direction of the plurality of strip-shaped structures 21 is the same as that of the plurality of strip-shaped connection terminals 11 in the signal unit 1, and the interval between the plurality of strip-shaped structures 21 is the same as that between the plurality of strip-shaped connection terminals 11. Preferably, the length and width of each strip-shaped structure 21 are respectively the same as those of the corresponding strip-shaped connection terminal 11.

In the present embodiment, by adding in the gap region 2 the strip-shaped structures 21 which have the same pattern and size as the strip-shaped connection terminals 11 in the signal unit 1 located at the corresponding edge, and by making the extending direction of the strip-shaped structures 21 be the same as that of the strip-shaped connection terminals 11 (i.e., be parallel to the movement direction of the rubbing roller), a uniform state of the rubbing cloth can be formed in advance when the rubbing roller passes the edge region (equivalent to evenly combing the rubbing cloth in advance by means of the strip-shaped structures 21 and the strip-shaped connection terminals 11), so as to ensure the rubbing roller to have a uniform state as possible when rubbing the display area of the array substrate that comes subsequently, and to ensure consistency of the rubbing effects applied by the rubbing roller on the alignment film.

In the array substrate, the display area is provided with a control element (not shown in FIG. 2). The signal unit 1 is connected to the control element and an external control signal supplying unit (not shown in FIG. 2). The auxiliary unit has the same layered structure as the signal unit and the control element. In general case, the signal unit 1 is a binding IC for binding the external control signal supplying unit and transmitting the external control signal to the thin film transistor of the display area. The external control signal supplying unit is for example a flexible printed circuit (FPC).

Specifically, in the present embodiment, the signal unit 1 includes a plurality of layers and is provided with a connection line for transmitting the external control signal to the thin film transistor of the display area (e.g., a connection line for connecting with the gate line or the data line). A signal metal layer located at the bottom layer in the signal unit 1 is connected with the gate line for connecting a same row/column in the thin film transistor array, and the signal metal layer and the gate line are formed by using the same material in the same patterning process. The respective layers located above the signal metal layer have the same pattern as the signal metal layer, and respectively correspond to the respective layers in the thin film transistor. The control element is a thin film transistor array. The thin film transistor includes a gate, a gate insulator layer, an active layer, a source and a drain disposed in a same layer, a passivation layer and a pixel electrode layer, and the gates of the thin film transistors arranged in a same row/column are connected with a same gate line. Correspondingly, the auxiliary unit includes an auxiliary gate layer, an auxiliary gate insulator layer, an auxiliary active layer, an auxiliary source/drain layer, an auxiliary passivation layer and an auxiliary pixel electrode layer disposed above the auxiliary passivation layer, which correspond to respective layers of the thin film transistor. The thicknesses of respective layers in the auxiliary unit are respectively the same as those of the respective corresponding layers of the thin film transistor. Thereby, the auxiliary unit has the same layered structure as the signal unit and the control element.

Preferably, the respective layers in the auxiliary unit and the respective corresponding layers of the thin film transistor are formed by using the same material, and the respective layers in the auxiliary unit and the respective corresponding layers of the thin film transistor are formed in the same patterning process (by only correspondingly adjusting the pattern of the mask plate in the corresponding non-display area when forming the patterns of the respective layers), so as to further simplify the process flow.

In order to connect the signal unit 1 with the external control signal supplying unit, connection via-holes 12 are provided in the strip-shaped connection terminals 11. Correspondingly, auxiliary via-holes 22 are provided in the strip-shaped structures 21 at positions corresponding to the connection via-holes 12 provided in the strip-shaped connection terminals 11. The auxiliary via-holes 22 and the connection via-holes 12 have the same size and depth, so as to further ensure the state of the rubbing cloth to be uniform.

The auxiliary via-holes 22 include auxiliary gate insulator layer via-holes provided in the auxiliary gate insulator layer, and/or auxiliary passivation layer via-holes provided in the auxiliary passivation layer. That is, the auxiliary via-holes 22 may be formed by providing via-holes in any one of the auxiliary gate insulator layer or the auxiliary passivation layer, or may be formed by providing via-holes in both of the auxiliary gate insulator layer and the auxiliary passivation layer, as long as the auxiliary via-holes 22 and the connection via-holes 12 have the same size and depth. Thus, the present invention is not limited in this aspect.

In order to ensure the product yield, a test unit 3 is further disposed at a position in the non-display area close to the display area. The test unit 3 is correspondingly disposed in a distribution region corresponding to the strip-shaped structures 21 in the auxiliary unit. That is, the test unit 3 is disposed outside of the display area and located in a region inside the non-display area near to the edge region. The test unit 3 includes a plurality of separately disposed test pads 31 for connecting with the thin film transistors, and the test pads 31 may be used to for example perform an ET lighting test. Test via-holes 32 are provided in the test pads 31 for connecting a plurality of array substrate units to test them together, so as to improve the test efficiency.

In the array substrate according to the present embodiment, the test pad 31 is formed in the same layer as the gate and the gate line, and is isolated by the gate insulator layer (the test via-holes 32 are provided in the test pad 31 in order to facilitate signal transmission). Although the structure of the above test pad 31 has a difference from the strip-shaped connection terminals 11 and the connection via-holes 12 in the signal unit 1, because the auxiliary unit corresponding to the signal unit 1 is provided in the array substrate in the edge region of the non-display area in which the test pad 31 is disposed, be means of the corresponding consistency between the strip-shaped structures 21 as well as the auxiliary via-holes 22 provided therein in the auxiliary unit and the strip-shaped connection terminals 11 as well as the connection via-holes 12 provided therein, a uniform state of the rubbing cloth can be formed in advance when the rubbing roller passes the edge region (equivalent to evenly combing the rubbing cloth in advance by means of the strip-shaped structures 21 and the strip-shaped connection terminals 11), thereby reducing Rubbing Mura.

The array substrate according to the present embodiment provides a new pattern design of the peripheral non-display area. By disposing in the gap region an auxiliary unit which has the same pattern as the partial surface of the signal unit, on the basis of reserving the original functions (i.e., on the basis of meeting the original functions such as ET lighting and binding), the segment difference in the non-display area due to the wiring is eliminated, and Rubbing Mura due to uneven rubbing strength of the rubbing roller on the periphery is reduced or eliminated, thereby achieving consistent rubbing effects. The effect of improving Rubbing Mura is apparent, such that the array substrate can obtain an alignment film having good alignment consistency, which has great significance for improvement of product quality and yield. Meanwhile, it can further reduce the influence on the rubbing cloth, prolong the service life of the rubbing cloth, and increase the utilization rate of the rubbing cloth provided in the rubbing roller, which has important significance for production capacity increase, cost reduction and quality improvement.

Another embodiment of the present invention provides a display device comprising the array substrate described above.

The display device may be any product or component with a display function, such as a liquid crystal panel, electronic paper, a cell phone, a tablet computer, a television set, a monitor, a notebook computer, a digital photo frame, and a navigator.

Because the display device uses the array substrate having an alignment film with good alignment consistency, it has a good display effect.

It should be understood that the above embodiments are merely exemplary embodiments employed to explain the principles of the present invention. However, the present invention is not limited thereto. Those skilled in the art may make various variations and improvements without departing from the spirit and essence of the present invention, and such variations and improvements should be considered as falling into the protection scope of the present invention.

The invention claimed is:

1. An array substrate comprising:
a display area; and
a non-display area located in a periphery of the display area, the non-display area being provided with a signal unit for transmitting an external control signal and a gap region in which the signal unit is not disposed, wherein:
an auxiliary unit is disposed in the gap region, the auxiliary unit and the signal unit have a same height and are electrically isolated from each other, and a surface pattern of the signal unit is the same as a surface pattern of the auxiliary unit in any corresponding part; and
a control element is disposed in the display area, the signal unit is connected to the control element and an external control signal supplying unit, and the auxiliary unit has a same layered structure as the signal unit and the control element.

2. The array substrate according to claim 1, wherein:
the signal unit is disposed at an edge in the non-display area away from the display area, and a plurality of parallel-arranged strip-shaped connection terminals are disposed in the signal unit;
the gap region is disposed at the edge in the non-display area corresponding to the signal unit, and the auxiliary unit includes a plurality of parallel-arranged strip-shaped structures; and
an arranging direction of the plurality of parallel-arranged strip-shaped structures being the same as an arranging direction of the plurality of parallel-arranged strip-shaped connection terminals in the signal unit, and an interval between the plurality of parallel-arranged strip-shaped structures being the same as an interval between the plurality of parallel-arranged strip-shaped connection terminals.

3. The array substrate according to claim 2, wherein a length and a width of each of the plurality of parallel-arranged strip-shaped structures are respectively the same as a length and a width of each of the plurality of parallel-arranged strip-shaped connection terminals.

4. The array substrate according to claim 3, wherein:
a test unit is further disposed at a position in the non-display area close to the display area, and the test unit is correspondingly disposed in a distribution region corresponding to the plurality of parallel-arranged strip-shaped structures in the auxiliary unit; and
the test unit includes a plurality of separately disposed test pads for connecting with the thin film transistors, and test via-holes are provided in the plurality of separately disposed test pads.

5. The array substrate according to claim 2, wherein:
a test unit is further disposed at a position in the non-display area close to the display area, and the test unit is correspondingly disposed in a distribution region corresponding to the plurality of parallel-arranged strip-shaped structures in the auxiliary unit; and
the test unit includes a plurality of separately disposed test pads for connecting with the thin film transistors, and test via-holes are provided in the plurality of separately disposed test pads.

6. The array substrate according to claim 1, wherein:
the control element is a thin film transistor array, each thin film transistor of the thin film transistor array includes a gate, a gate insulator layer, an active layer, a source and a drain disposed in a same layer, a passivation layer and a pixel electrode layer, and the gates of the thin film transistors arranged in a same row/column are connected with a same gate line; and
the auxiliary unit includes an auxiliary gate layer, an auxiliary gate insulator layer, an auxiliary active layer, an auxiliary source/drain layer, an auxiliary passivation layer and an auxiliary pixel electrode layer disposed above the auxiliary passivation layer, which correspond to respective layers of the thin film transistors, thicknesses of respective layers in the auxiliary unit being respectively the same as thicknesses of the respective layers of the thin film transistors.

7. The array substrate according to claim 6, wherein the respective layers in the auxiliary unit and the respective layers of the thin film transistors are formed by using a same material in a same patterning process.

8. The array substrate according to claim 7, wherein:
a test unit is further disposed at a position in the non-display area close to the display area, and the test unit is correspondingly disposed in a distribution region corresponding to the plurality of parallel-arranged strip-shaped structures in the auxiliary unit; and
the test unit includes a plurality of separately disposed test pads for connecting with the thin film transistors, and test via-holes are provided in the plurality of separately disposed test pads.

9. The array substrate according to claim 6, wherein:
connection via-holes are provided in the plurality of parallel-arranged strip-shaped connection terminals; and
auxiliary via-holes are provided in the plurality of parallel-arranged strip-shaped structures at positions corresponding to the connection via-holes in the plurality of parallel-arranged strip-shaped connection terminals, and the auxiliary via-holes and the connection via-holes have a same diameter and depth.

10. The array substrate according to claim 9, wherein the auxiliary via-holes include auxiliary gate insulator layer via-holes provided in the auxiliary gate insulator layer, and/or auxiliary passivation layer via-holes provided in the auxiliary passivation layer.

11. The array substrate according to claim 10, wherein:
a test unit is further disposed at a position in the non-display area close to the display area, and the test unit is correspondingly disposed in a distribution region corresponding to the plurality of parallel-arranged strip-shaped structures in the auxiliary unit; and
the test unit includes a plurality of separately disposed test pads for connecting with the thin film transistors, and test via-holes are provided in the plurality of separately disposed test pads.

12. The array substrate according to claim 9, wherein:
a test unit is further disposed at a position in the non-display area close to the display area, and the test unit is correspondingly disposed in a distribution region corresponding to the plurality of parallel-arranged strip-shaped structures in the auxiliary unit; and the test unit includes a plurality of separately disposed test pads for connecting with the thin film transistors, and test via-holes are provided in the plurality of separately disposed test pads.

13. The array substrate according to claim 6, wherein a test unit is further disposed at a position in the non-display area close to the display area, and the test unit is correspondingly disposed in a distribution region corresponding to the plurality of parallel-arranged strip-shaped structures in the auxiliary unit; and the test unit includes a plurality of separately disposed test pads for connecting with the thin film transistors, and test via-holes are provided in the plurality of separately disposed test pads.

14. The array substrate according to claim 1, wherein:

a test unit is further disposed at a position in the non-display area close to the display area, and the test unit is correspondingly disposed in a distribution region corresponding to the plurality of parallel-arranged strip-shaped structures in the auxiliary unit; and the test unit includes a plurality of separately disposed test pads for connecting with the thin film transistors, and test via-holes are provided in the plurality of separately disposed test pads.

15. A display device comprising:

an array substrate comprising:

a display area; and a non-display area located in a periphery of the display area, the non-display area being provided with a signal unit for transmitting an external control signal and a gap region in which the signal unit is not disposed, wherein:

an auxiliary unit is disposed in the gap region, the auxiliary unit and the signal unit have a same height and are electrically isolated from each other, and a surface pattern of the signal unit is the same as a surface pattern of the auxiliary unit in any corresponding part; and wherein a control element is disposed in the display area, the signal unit is connected to the control element and an external control signal supplying unit, and the auxiliary unit has a same layered structure as the signal unit and the control element.

16. The display device according to claim 15, wherein:

the signal unit is disposed at an edge in the non-display area away from the display area, and a plurality of parallel-arranged strip-shaped connection terminals are disposed in the signal unit;

the gap region is disposed at the edge in the non-display area corresponding to the signal unit, and the auxiliary unit includes a plurality of parallel-arranged strip-shaped structures; and an arranging direction of the plurality of parallel-arranged strip-shaped structures being the same as an arranging direction of the plurality of parallel-arranged strip-shaped connection terminals in the signal unit, and an interval between the plurality of parallel-arranged strip-shaped structures being the same as an interval between the plurality of parallel-arranged strip-shaped connection terminals.

17. The display device according to claim 16, wherein a length and a width of each of the plurality of parallel-arranged strip-shaped structures are respectively the same as a length and a width of the plurality of parallel-arranged strip-shaped connection terminals.

* * * * *